(12) United States Patent
Mohseni et al.

(10) Patent No.: US 12,013,352 B2
(45) Date of Patent: Jun. 18, 2024

(54) SPACE-TIME SCATTERING NETWORK FOR INVERSE DESIGN AND TOMOGRAPHY

(71) Applicant: Northwestern University, Evanston, IL (US)

(72) Inventors: Hooman Mohseni, Wilmette, IL (US); Travis G. Hamilton, Chicago, IL (US)

(73) Assignee: Northwestern University, Evanston, IL (US)

( * ) Notice: Subject to any disclaimer, the term of this patent is extended or adjusted under 35 U.S.C. 154(b) by 412 days.

(21) Appl. No.: 17/279,453

(22) PCT Filed: Sep. 26, 2019

(86) PCT No.: PCT/US2019/053143
§ 371 (c)(1),
(2) Date: Mar. 24, 2021

(87) PCT Pub. No.: WO2020/069121
PCT Pub. Date: Apr. 2, 2020

(65) Prior Publication Data
US 2022/0034824 A1    Feb. 3, 2022

Related U.S. Application Data

(60) Provisional application No. 62/736,610, filed on Sep. 26, 2018.

(51) Int. Cl.
*G01N 23/046* (2018.01)
*G06N 3/049* (2023.01)
*G06T 11/00* (2006.01)

(52) U.S. Cl.
CPC ......... *G01N 23/046* (2013.01); *G06N 3/049* (2013.01); *G06T 11/006* (2013.01)

(58) Field of Classification Search
CPC ..... G01N 23/046; G06N 3/049; G06T 11/006
See application file for complete search history.

(56) References Cited

U.S. PATENT DOCUMENTS 6,441,821 B1    8/2002 Nagasawa
6,546,072 B1 *  4/2003 Chalmers ............. G01V 5/0016
                                                      378/57

(Continued)

OTHER PUBLICATIONS

A. A. Michelson and E. W. Morley, "On the Relative Motion of the Earth and of the Luminiferous Ether," *Sidereal Messenger*, vol. 6; pp. 306-310, 1887.

(Continued)

*Primary Examiner* — Hugh Maupin
(74) *Attorney, Agent, or Firm* — Bell & Manning, LLC

(57) ABSTRACT

A system to generate a space-time scattering network includes a computing unit configured to store a space-time scattering network (STSN) algorithm. The computing unit also executes the STSN algorithm to represent scattering of light through a material mathematically as a tensor field at a location. The computing unit also generates a subnet that represents the tensor field at the location. The computing unit also identifies, based on a translation operator, connections between a plurality of subnets, where each of the subnets in the plurality of subnets represents a given tensor field at a given location. The computing unit also forms the STSN based at least in part on the identified connections between the plurality of subnets. The computing unit further uses the STSN to inversely design an optical component or to perform tomography.

14 Claims, 14 Drawing Sheets

(56) References Cited

U.S. PATENT DOCUMENTS

| | | | |
|---|---|---|---|
| 2006/0045380 A1 | 3/2006 | Jones et al. | |
| 2010/0110559 A1* | 5/2010 | Cai | H01Q 17/00 |
| | | | 703/1 |
| 2010/0225562 A1* | 9/2010 | Smith | H01Q 15/02 |
| | | | 702/179 |
| 2011/0098992 A1* | 4/2011 | Van Beurden | G03F 7/70625 |
| | | | 703/2 |
| 2013/0094084 A1* | 4/2013 | Merrill | G02B 5/285 |
| | | | 359/485.03 |
| 2014/0180655 A1* | 6/2014 | Chipman | G02B 27/0012 |
| | | | 703/2 |
| 2016/0204515 A1* | 7/2016 | Smith | H01Q 13/28 |
| | | | 343/772 |
| 2017/0285123 A1 | 10/2017 | Kaditz et al. | |
| 2019/0129026 A1* | 5/2019 | Sumi | G01S 15/8915 |
| 2019/0347790 A1* | 11/2019 | Lee | A61B 5/0075 |
| 2021/0271853 A1* | 9/2021 | Cotte | G06V 20/695 |

OTHER PUBLICATIONS

F. C. X. S. a. A. D.-A. Marcel Urban, "The quantum vacuum as the origin of the speed of light," *The European Physical Journal D*, vol. 67, No. 3; 58, pp. 1-6, 2013.

G. Leuchs, A. S. Villar and L. L. Sanchez-Soto, "The quantum vacuum at the foundations of classical electrodynamics," *Applied Physics B*, vol. 100, No. 1, pp. 9-13, 2010.

S. Molesky, Z. Lin, A. Y. Piggott, W. Jin, J. Vuković and A. W. Rodriguez, "Outlook for inverse design in nanophotonics," *arXiv*, Jan. 20, 2018; pp. 1-13.

A. Y. Piggott, J. Lu, K. G. Lagoudakis, J. Petykiewicz, T. M. Babinec and J. Vuković, "Inverse design and demonstration of a compact and broadband on-chip wavelength demultiplexer," *Nature Photonics*, vol. 9, pp. 374-377, 2015.

L. Su, Alexander Y. Piggott, N. V. Sapra, J. Petykiewicz and J. Vukovic, "Inverse Design and Demonstration of a Compact on-Chip Narrowband Three-Channel Wavelength Demultiplexer," *ACS Photonics*, vol. 5, No. 2, pp. 301-305, 2017.

Aydin, "Inverse-designed stretchable metalens with tunable focal distance," *Applied Physics Letters*, vol. 112, 091102 (2018).

Logan Su et al., "Fully-automated optimization for grating couplers," *Optics Express* Feb. 19, 2018, vol. 26, No. 4; pp. 1-12.

U. S. Kamilov et al., "Learning Approach to optical tomography," *Optica*, vol. 2, No. 6, Jun. 2015; pp. 517-522.

U. S. Kamilov, D. Liu, H. Mansour and P. T. Boufounos, "A Recursive Born Approach to NonlinearInverse Scattering," *IEEE Signal Processing Letters*, vol. 23, No. 8, pp. 1052-1056, 2016.

Jaejun Yoo et al., Deep Learning Diffuse Optical Tomography, arXiv, Sep. 9, 2019; pp. 1-13.

Itzik Malkiel et al., "Deep Learning for Design and Retrieval of Nano-photonic Structures" School of Computer Science, Faculty of Exact Sciences, Tel Aviv University, Tel Aviv 69978 Israel; pp. 1-13.

John Peurifoy et al., "Nanophotonic Particle Simulation and Inverse Design Using Artificial Neural Networks" Science Advances Jun. 1, 2018, vol. 4: eaar4206; pp. 1-7.

Tobias Wurfl et al., "Deep Learning Computed Tomography" *IEEE Transactions on Medical Imaging*, vol. 37, No. 6, Jun. 2018; pp. 1454-1463.

P. Mehnati, "Assessing Absorption Coefficient of Hemoglobin in the Breast Phantom Using Near-Infrared Spectroscopy" *Iran J. Radiol.*, Oct. 2016, vol. 13, No. 4; e31581.

J. K. Koga and T. Hayakawa, "Possible precise measurement of Belbruck Scatterin using polarized photon beams," *Physical Review Letters*, vol. 118, No. 204801, pp. 1-5, 2017.

The International Search Report and the Written Opinion issued for international patent application No. PCT/US19/53143 dated Dec. 18, 2019; pp. 1-9.

Qi et al., "Space-time random tensor networks and holographic duality," In: Cornell University Library/High Energy Physics—Theory, Jan. 16, 2018, [online] [retrieved on Nov. 17, 2019] Retrieved from the Internet, URL: https://arxiv.org/abs/1801.05289., entire document, especially Abstract; pp. 5-8, 14-18, 23-24.

Liu et al., "Training deep neural networks for the inverse design of nanophotonic structures." In: Cornell University Library/ Physics/ Optics, Oct. 12, 2017, [online] (retrieved on Nov. 17, 2019] Retrieved from the Internet , URL: https//arxiv.org/abs/1710.04724., entire document, especially Abstract; pp. 2-8.

\* cited by examiner

| Figure 3 | Unknowns | Time Changes | Average of Percent Error | Standard Deviation of Percent Error |
|---|---|---|---|---|
| 3A | 180 | 1 | 3.73% | 18.27% |
| 3B | 180 | 2 | 0.92% | 6.85% |
| 3C | 180 | 3 | 2.23% | 14.74% |
| 3F | 11 | 0 | 0.00064% | 0.0013% |
| 3G | 11 | 0 | 0.0011% | 0.0013% |
| 3H | 11 | 0 | 0.0014% | 0.0010% |
| 3A* | 180 | 1 | 0.64% | 7.76% |
| 3B* | 180 | 2 | 0.0084% | 0.048% |
| 3C* | 180 | 3 | 0.0023% | 0.0089% |

Fig. 4

| Model | Layers | Weights | Training Sets | Saturation Epoch |
|---|---|---|---|---|
| STSN | 200 | 60 | 1 | 100 |
| Ref. Model | 6 | >300,000 | 550,000 | 2000 |

Fig. 6

SPACE-TIME SCATTERING NETWORK FOR INVERSE DESIGN AND TOMOGRAPHY

CROSS-REFERENCE TO RELATED APPLICATION

This application is a National Stage of International Application No. PCT/US19/53143, filed Sep. 26, 2019, which claims the priority benefit of U.S. Provisional Patent Application No. 62/736,610, filed Sep. 26, 2018, the entire disclosures of which are incorporated by reference.

BACKGROUND

Light propagating through a vacuum has motivated scientific research for over three centuries. This phenomenon was initially explained through the luminiferous aether theory, or the concept of an ever-present but undetectable medium that facilitated light propagation in the absence of matter. However, the luminiferous aether theory lacks empirical evidence and was abandoned in favor of the simple axiom that the speed of light in vacuum is constant. The particle-based theory of light allows for particle-particle interactions, which naturally give way to discrete models and relies on a sea of background particles to facilitate light propagation. Such a view of light propagation is in harmony with modern physics. However, Maxwell's equations, and the continuous wave equation that they imply, are the most ubiquitous models of light propagation. The wave equation, however, does not provide an inherently discrete physical model, and forces computer simulations to approximate discrete forms of Maxwell's equation.

SUMMARY

An illustrative system to generate a space-time scattering network includes a computing unit configured to store a space-time scattering network (STSN) algorithm. The computing unit also executes the STSN algorithm to represent scattering of light through a material mathematically as a tensor field at a location. The computing unit also generates a subnet that represents the tensor field at the location. The computing unit also identifies, based on a translation operator, connections between a plurality of subnets, where each of the subnets in the plurality of subnets represents a given tensor field at a given location. The computing unit also forms the STSN based at least in part on the identified connections between the plurality of subnets. The computing unit further uses the STSN to inversely design an optical component or to perform tomography.

An illustrative method for generating a space-time scattering network includes representing, by a computing unit, scattering of light through a material mathematically as a tensor field at a location. The method also includes generating, by the computing unit, a subnet that represents the tensor field at the location. The method also includes identifying, by the computing unit and based on a translation operator, connections between a plurality of subnets, where each of the subnets in the plurality of subnets represents a given tensor field at a given location. The method also includes forming, by the computing unit, the STSN based at least in part on the identified connections between the plurality of subnets. The method further includes using, by the computing unit, the STSN to inversely design an optical component or to perform tomography.

Another illustrative embodiment is directed to a tangible computer-readable medium having computer-readable instructions stored thereon. Upon execution by a processor of a computing system, the computer-readable instructions cause the computing system to represent scattering of light through a material mathematically as a tensor field at a location. The computer-readable instructions also cause the computing system to generate a subnet that represents the tensor field at the location. The computer-readable instructions also cause the computing system to identify, based on a translation operator, connections between a plurality of subnets. Each of the subnets in the plurality of subnets represents a given tensor field at a given location. The computer-readable instructions also cause the computing system to form a space-time scattering network (STSN) based at least in part on the identified connections between the plurality of subnets. The computer-readable instructions further cause the computing system to use the STSN to inversely design an optical component or to perform tomography.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 4 depicts the percent error average and standard deviation between the ground truth and trained refractive index distributions shown in FIG. 3 in accordance with an illustrative embodiment.

FIG. 6 is a table depicting a comparison of the computing resources utilized by the STSN and the reference technique to inversely design the notch filter in accordance with an illustrative embodiment.

DETAILED DESCRIPTION

Figure 1A:
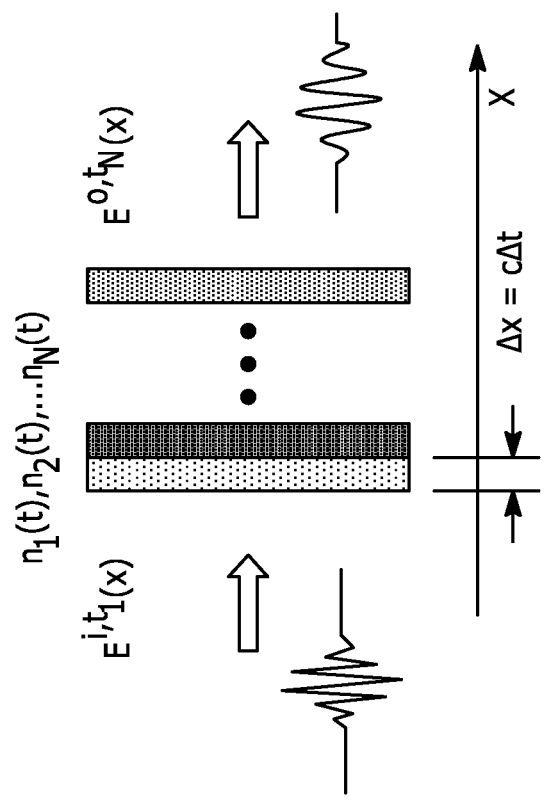
FIG. 1A depicts the essence of a 1D STSN model in accordance with an illustrative embodiment.

Maxwell's equations generally explain the propagation of light through an arbitrary medium by using wave mechanics. However, scientific evidence since Newton's time suggests that a discrete interpretation of light more generally explains its nature. This interpretation lends itself well to the discrete form of computer simulation. While current simulations attempt to discretize Maxwell's equations, described herein is an inherently discrete physical model of light propagation that naturally forms a causal space-time scattering network (STSN). Since a STSN has the topology of a neural network, inverse design and tomography based on STSNs can be readily implemented in a variety of software and hardware that are optimized for deep learning. Also, STSNs inherently include the physics of light propagation, and hence the number of unknown weights in an STSN is at a minimum. As discussed herein, this property leads to orders of magnitude smaller number of unknown weights, and a much faster convergence, compared with inverse design methods using conventional neural networks. In addition, the intrinsic presence of the space-time fabric in STSNs allows for time-dependent inverse design and tomography. Demonstrated in the examples below is the fast convergence of an STSN in predicting time-dependent index profiles, while avoiding approximations typically used.

More specifically, a non-wave view of light propagation is utilized herein to construct an inherently discrete and highly efficient computational model to compute light propagation through a medium (including vacuum) with arbitrary space and time-dependent optical properties (i.e. the forward model), and to predict a possible medium that can generate a given optical response (i.e. inverse model). Due to its predictive nature, the model is highly relevant in fields involving inverse design to predict unknown structures and create non-intuitive devices.

Inverse design has emerged as an exciting methodology for creating highly complex and compact photonic and microwave devices. The goal of inverse design, broadly speaking, is to solve for a suitable material design that approximates a desired electromagnetic response. Tomography is similar to inverse design in nature, except that a unique solution is sought after.

The existing tomography and inverse design methods belong to three categories: physics-based optimization, physics-based optimization using neural networks, and non-physics optimization using neural networks. In physics-based optimization, the input/output characteristics are optimized to match a desired response by adjusting the refractive index of space while using Maxwell's equations as a constraint. While highly versatile, the method is not efficient for time-dependent problems and optimizes for one frequency at a time. In physics-based optimizations a neural network is used to implement a physical theory of light propagation. The network's weights are then trained by comparing the network's forward propagating output with the desired output. However, all existing methods use limiting approximations such as a beam propagation approximation, a Born approximation, and the Lippmann-Schwinger approximation. Methods using such limited approximations cannot be used for many important conditions, such as high index contrast and strong backscattering. Non-physics optimization using neural networks define a topological parameter of interest, train a neural network given electromagnetic inputs and outputs to learn the physics of the topology for a range of parameter values and optical constants, and invert the network to produce a topology that matches a desired input/output characteristic. Once a network is trained it can produce a design much faster than the previously mentioned methods. However, this approach is extremely inefficient computationally, and requires large data sets to train properly.

Described herein is a novel approach referred to as a space-time scattering network (STSN) that is based on the general scattering model of light propagation, and without any simplification. It is shown that an STSN can be efficiently implemented by commonly used software (e.g., open source TensorFlow), and hardware (e.g., CPU/GPU) for forward modeling, inverse design, and tomography in broadband and time-dependent optical systems that include large index contrasts and strong backscattering.

The STSN topology is described below. An initial assumption of the present technique is light scattering at subwavelength points within media, including vacuum. For simplicity, it is assumed that the scattering points are equally spaced on a Cartesian grid. It is noted that that neither assumption is necessary in general. Assuming causality holds, the scattering events are arranged across time, producing a static space-time fabric. Initially, the STSN was developed in one-dimensional space and it is shown how to expand it to higher dimensional space mathematically (the graphical representations are limited to 1D and 2D space, since the 3D space-time graph is not visually representable).

Figure 1B:
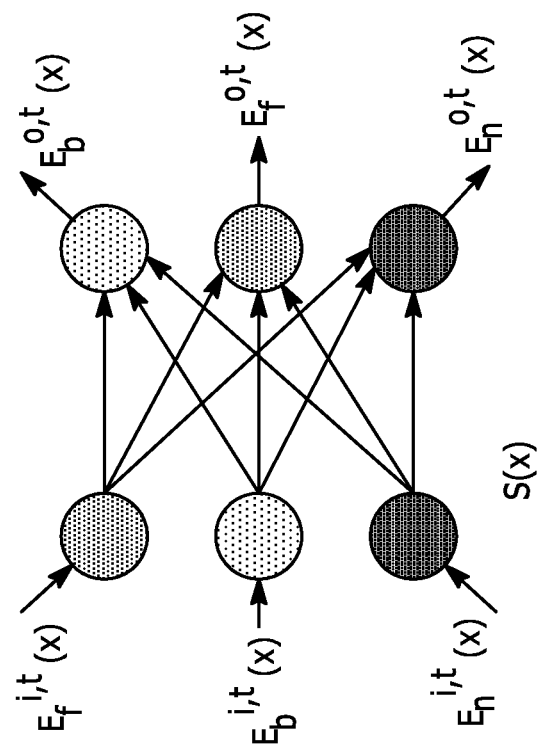
FIG. 1B depicts the tensor field $S(x)$ in accordance with an illustrative embodiment.
Figure 1C:
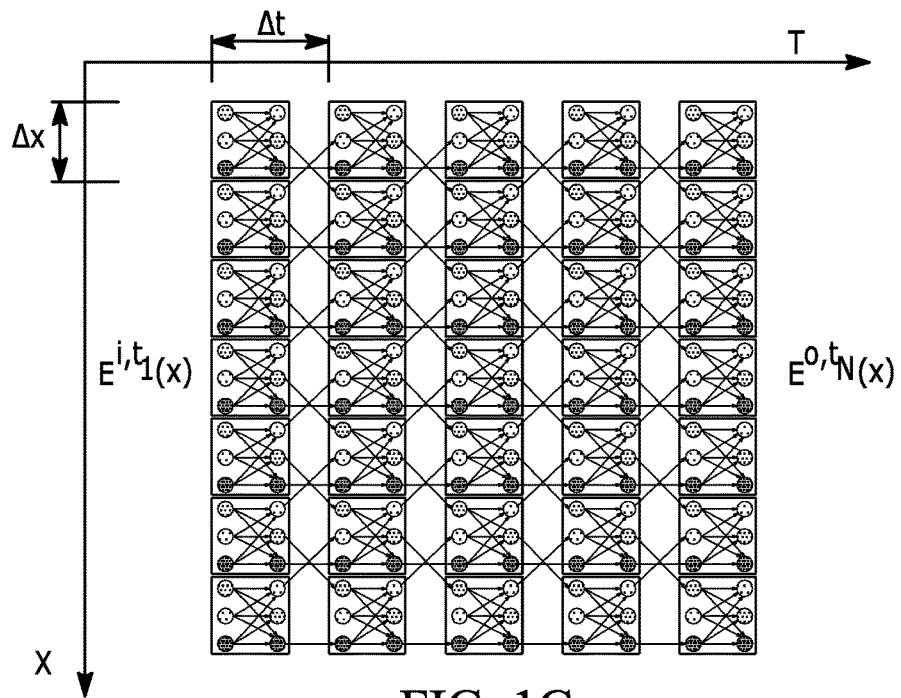
FIG. 1C depicts connections of scattering subnets as dictated by a translation operator T in accordance with an illustrative embodiment.

FIG. 1A depicts the essence of a 1D STSN model in accordance with an illustrative embodiment. Specifically, in FIG. 1A, a time-dependent and non-linear stack of subwavelength thick material slabs extend infinitely in the direction perpendicular to propagation, and their own unique refractive index values are to be solved using incoming and outgoing fields. The scattering of light is represented mathematically by a tensor field S(x) at a location given by the position vector x. It couples the incoming and outgoing fields which are compactly written as tensor fields $E^{i,t}(x)$ and $E^{o,t}(x)$ and have field components forward incoming/outgoing $E_f^{i/o,t}(x)$, backward incoming/outgoing $E_b^{i/o,t}(x)$, and node (local) incoming/outgoing $E_n^{i/o,t}(x)$. FIG. 1B depicts the tensor field S(x) in accordance with an illustrative embodiment. The tensor field S(x) is a scattering subnet coupling the incoming and outgoing fields. The forward and backward directions are with respect to the positive X direction in FIG. 1A. The tensor field S(x) at a given location is represented as a subnet and will become the fundamental building block of the STSN. FIG. 1C depicts connections of scattering subnets as dictated by a translation operator T in accordance with an illustrative embodiment. Specifically, FIG. 1C shows a 2D space-time scattering network (STSN).

Figure 1D:
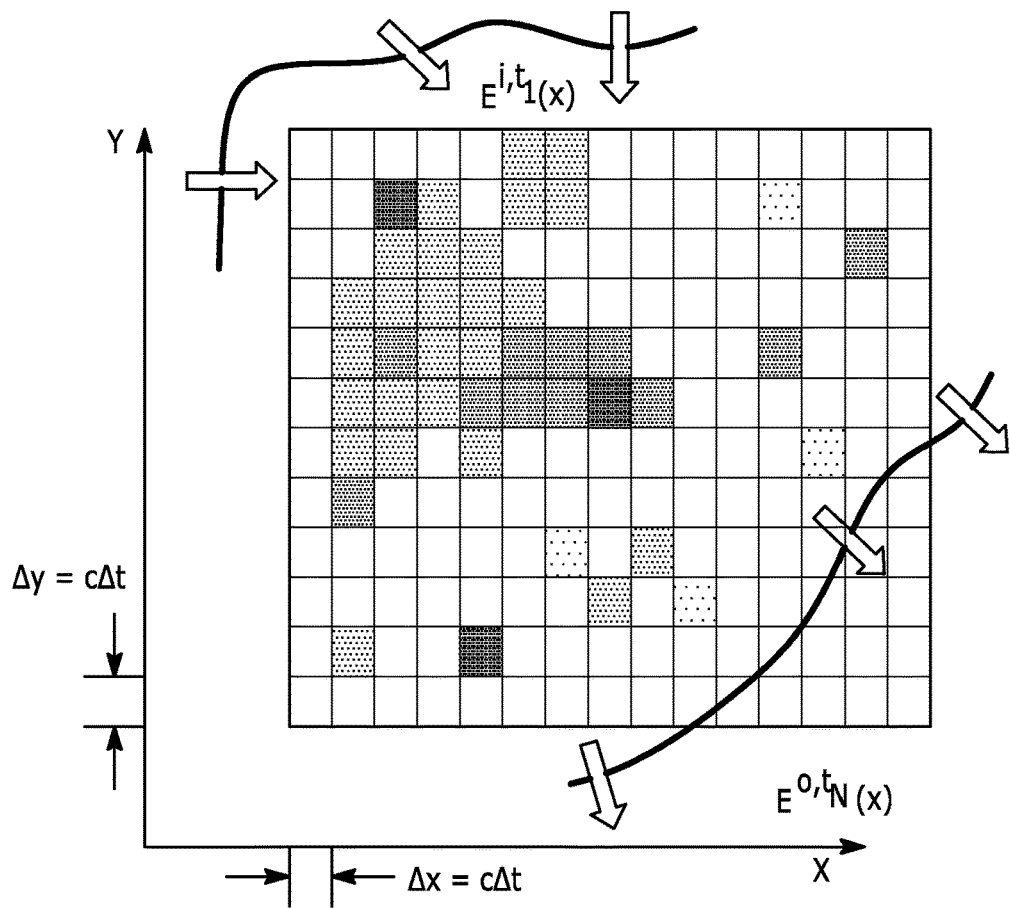
FIG. 1D depicts a 2D material grid of unknown refractive index materials in accordance with an illustrative embodiment.
Figure 1F:
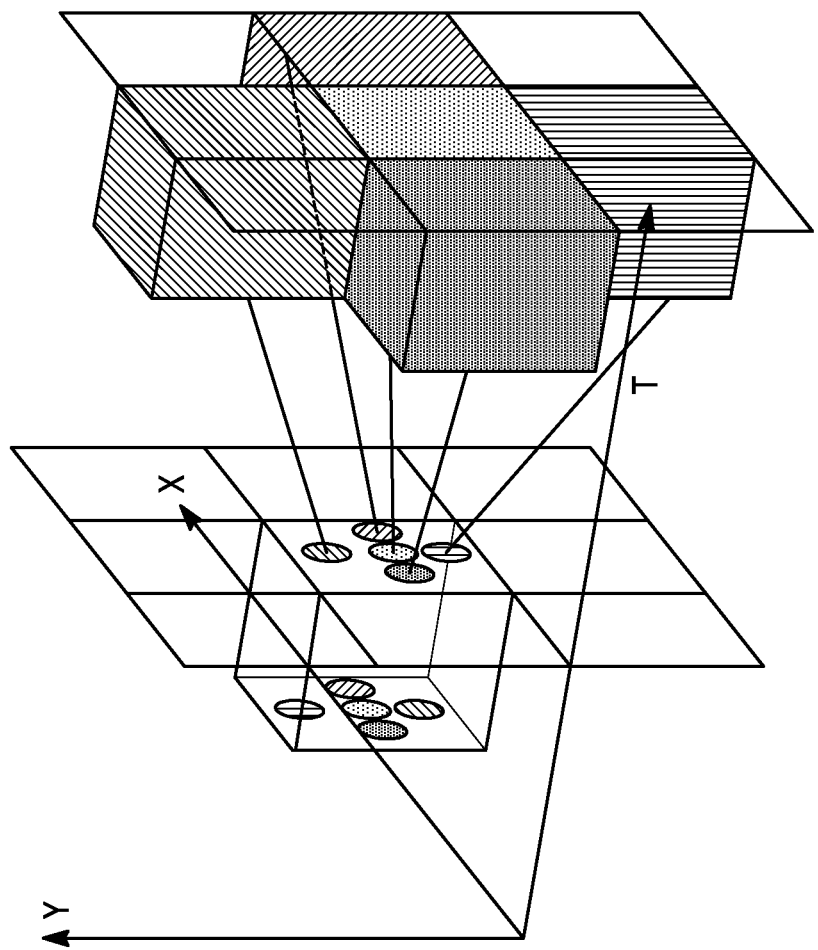
FIG. 1F depicts a three-dimensional (3D) STSN in accordance with an illustrative embodiment.
Figure 1E:
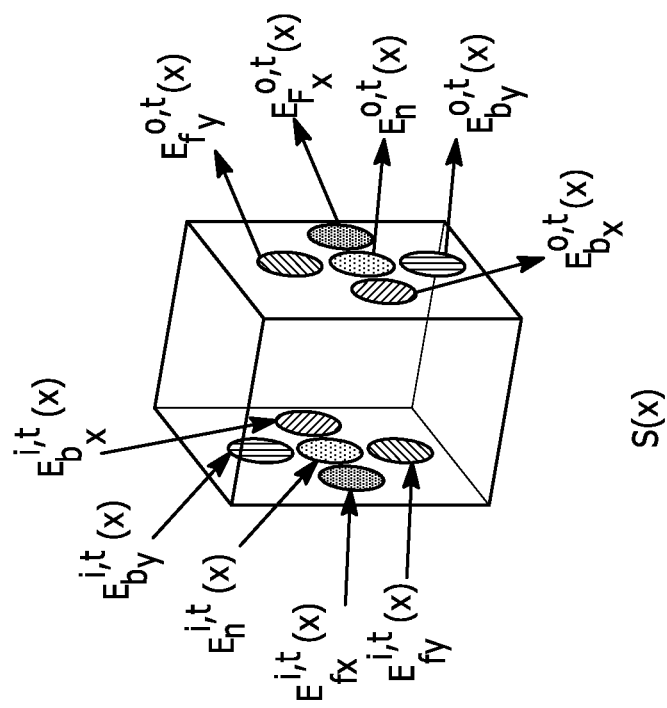
FIG. 1E depicts a scattering subnet in accordance with an illustrative embodiment.

The two-dimensional (2D) STSN follows from the 1D STSN. FIG. 1D depicts a 2D material grid of unknown refractive index materials in accordance with an illustrative embodiment. This 2D material grid, which is time-dependent and non-linear, is solved and the scattering subnet couples the X and Y field components. FIG. 1E depicts a scattering subnet in accordance with an illustrative embodiment. The scattering subnet of FIG. 1E couples the incoming and outgoing fields. FIG. 1F depicts a three-dimensional (3D) STSN in accordance with an illustrative embodiment. The network of FIG. 1F is 3D due to the two dimensions used for space and one dimension used for time. As in the 1D case, a translation operator defines the connections between scattering subnets.

Referring still to FIG. 1, the STSN in one dimension (1D) solves for the refractive index of a stack of materials (FIG. 1A) using the final outgoing and initial incoming fields. The scattering element of the 1D STSN (FIG. 1B) connects the field components of the outgoing and incoming fields at each point in space and is connected through the translation operator to form the full network (FIG. 1C). Similarly, in two dimensions (2D) a grid of refractive index values are solved for (FIG. 1D) using a scattering subnet (FIG. 1E) that now takes into account the x and y directions. The full network is shown in FIG. 1F.

Mathematically, the STSN can be described using the transmission line matrix theory (TLM), as known in the art. The STSN model can be expressed in a compact form for one, two, and higher dimensions. The scattering subnet is represented as a tensor field coupling the incoming and outgoing tensor fields: $E^{o,t}(x)=S(x)E^{i,t}(x)$. The connection to the next time step can be defined via a translation operator T, such that: $E^{i,t+\Delta t}(x)=T(E^{o,t}(x))$. It is noted that tensor field S is only related to the optical properties of the material, while operation T is simply producing interconnection between geometrically adjacent scattering points in space. The details of S and T are presented in more detail below.

To evaluate the accuracy of the proposed STSN model, simulation results of 1D and 2D examples were compared with results produced using a finite difference time domain (e.g., FDTD Solutions, Lumerical Inc.). Specifically, identical structures were simulated in both the proposed STSN and the finite difference time domain (FDTD), and the resulting fields show good agreement. The overlap integral value between the FDTD and STSN electric fields across all simulated space are 98.74% and 95.41% for the 1D and 2D cases, respectively.

Figure 2A:
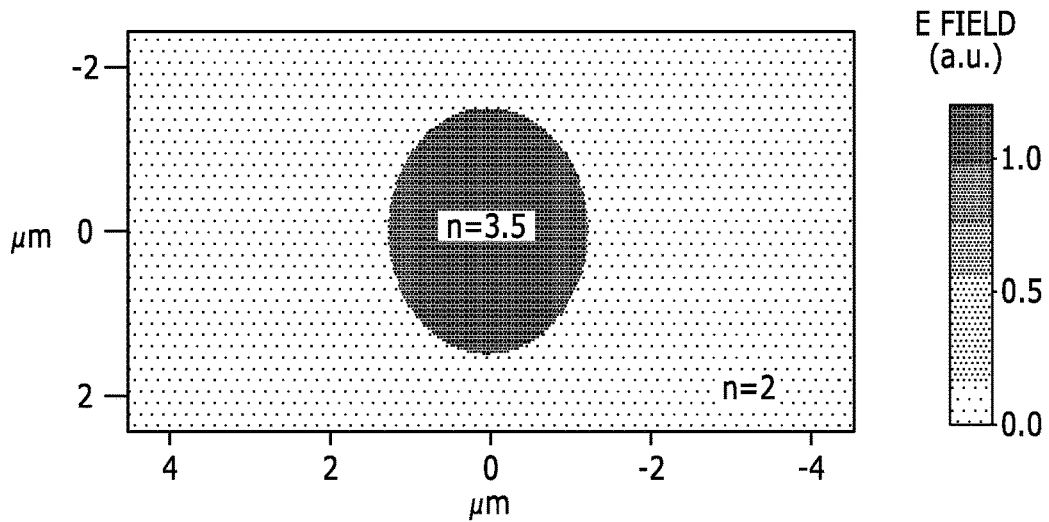
FIG. 2A depicts a refractive index distribution for the 2D test case in accordance with an illustrative embodiment.
Figure 2B:
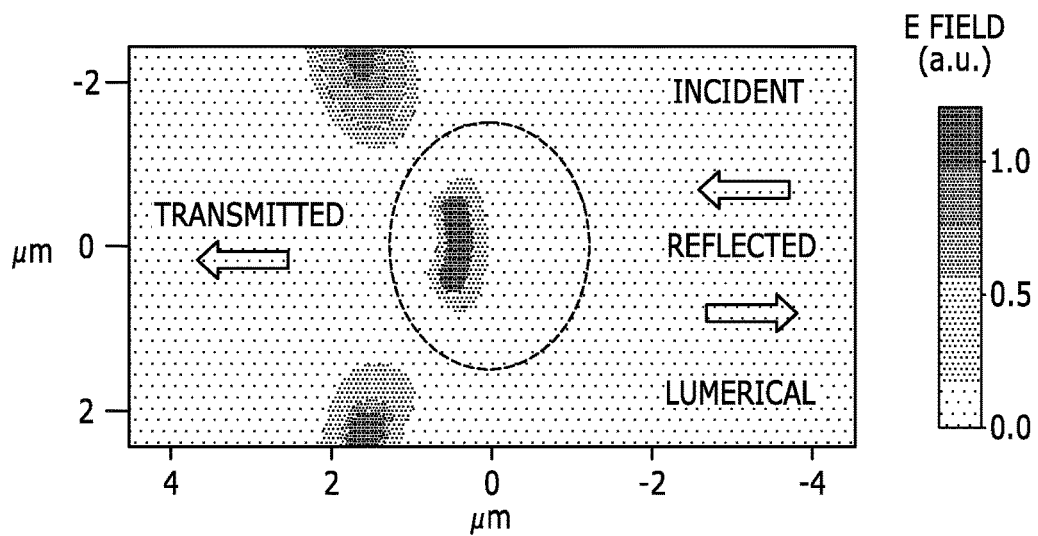
FIG. 2B depicts the 2D test case for the finite different time domain in accordance with an illustrative embodiment.
Figure 2C:
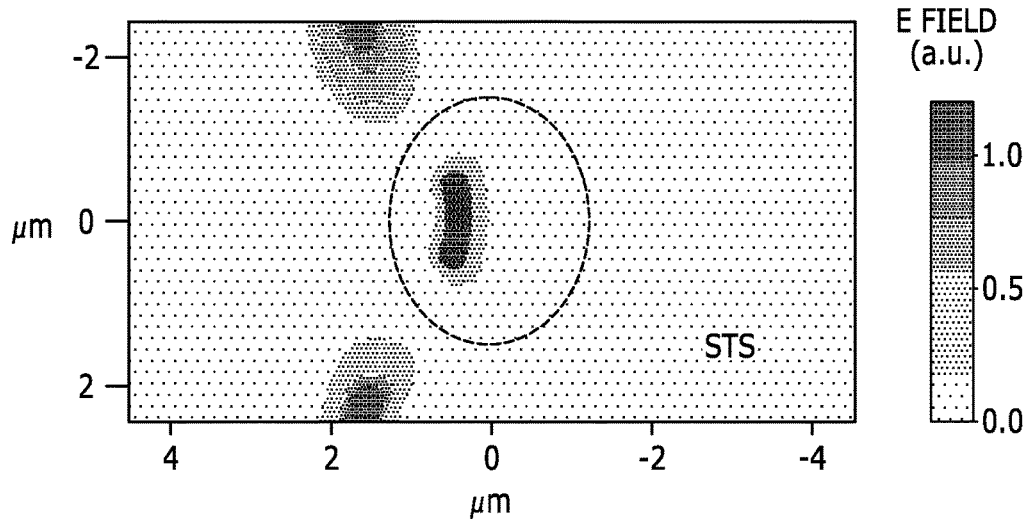
FIG. 2C depicts the 2D test case for the proposed STSN in accordance with an illustrative embodiment.
Figure 2D:
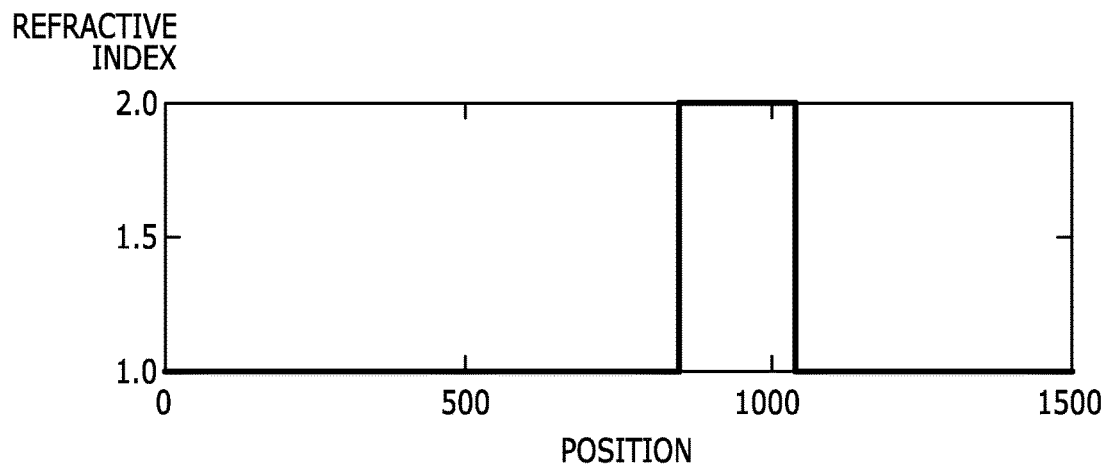
FIG. 2D depicts the refractive index distribution for the 1D test case in accordance with an illustrative embodiment.
Figure 2E:
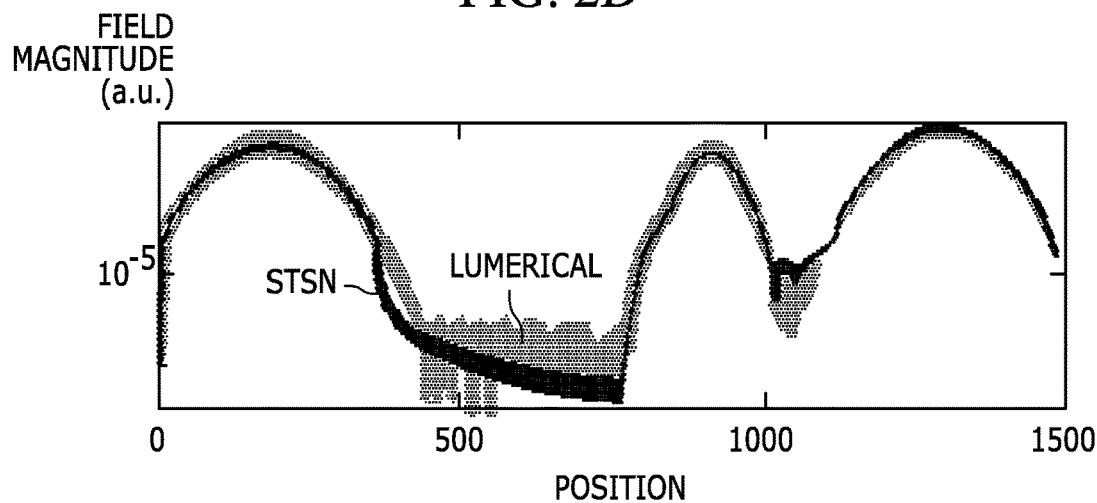
FIG. 2E depicts the 1D test case for Lumerical and STSN in accordance with an illustrative embodiment.
Figure 2F:
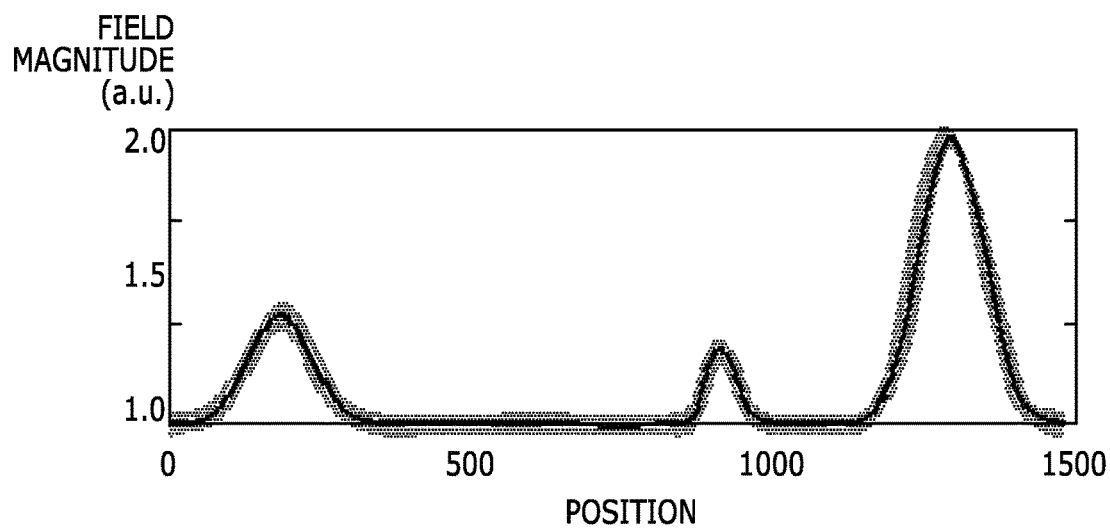
FIG. 2F depicts field magnitude vs. position for Lumerical and STSN in accordance with an illustrative embodiment.

FIGS. 2A-2F depict validation of the proposed STSN using a finite difference time domain software package. FIG. 2A depicts a refractive index distribution for the 2D test case in accordance with an illustrative embodiment. FIG. 2B depicts the 2D test case for the finite different time domain in accordance with an illustrative embodiment. FIG. 2C depicts the 2D test case for the proposed STSN in accordance with an illustrative embodiment. FIG. 2D depicts the refractive index distribution for the 1D test case in accordance with an illustrative embodiment. FIGS. 2E and 2F depict the 1D test case for Lumerical and STSN in accordance with an illustrative embodiment.

The proposed STSN can be used for inverse design and tomography. An STSN naturally forms a network that has a forward flow in the direction of the 'arrow of time,' and can be readily implemented by any software/hardware designed for neural networks (NN) and deep learning. It is noted that the number of unknown weights in the resulting neural network is exactly equal to the number of unknown optical parameters in the system (i.e. number of parameters in the design space), which is the minimum possible number of unknown weights. This is in stark contrast with the non-physics based neural networks, where the number of unknown weights is typically much larger than the number of parameters in the design space, since many of the weights are used by the network to learn the physics involved.

In one embodiment, the STSN can be implemented as a neural network (NN) in software (e.g., the open source program TensorFlow®) where the layers of the graph are defined by a scattering subnet S(x) and a translation operator T. In alternative embodiments, a different program may be used to implement the STSN. The scattering tensor field at one point in space $S(x=(x_i, y_j, z_k))$ produces a two-layer subnet, as shown in FIGS. 1B and 1E. This subnet represents the optical properties of one point in space and its weights are directly related to the refractive index as discussed in more detail below. The subnets are linked through T, which pushes the network through time as shown in FIGS. 1C and 1F. It is noted that the subnet weights may differ across time as the refractive index changes with time. The weights are initialized to free space. An area of interest in the graph is defined across space where the refractive index is unknown and trainable. All weights outside the region are left constant.

FIG. 3 depicts results for time-dependent and time-independent refractive index distributions. Specifically, FIG. 3A depicts time-dependent results with 3 scatterers and 1 time change in accordance with an illustrative embodiment. FIG. 3B depicts time-dependent results with 3 scatterers and 2 time changes in accordance with an illustrative embodiment. FIG. 3C depicts time-dependent results with 3 scatterers and 3 time changes in accordance with an illustrative embodiment. In all three cases, there are 180 unknowns and the ground truth distribution is depicted above the trained distribution. FIG. 3F depicts time independent results with 2 scatterers in accordance with an illustrative embodiment. FIG. 3G depicts time independent results with 5 scatterers in accordance with an illustrative embodiment. FIG. 3H depicts time independent results with 9 scatterers in accordance with an illustrative embodiment. In all three cases there are 11 unknowns and the percent error between trained and ground truth for each position is shown. The region of trainable refractive index values range from 60 to 62 for the time dependent case and 100 to 110 for the static case. The least squares (L.S.) between the ground truth and trained refractive index values are also shown. FIG. 3D depicts the least squares error between ground truth and trained output fields for the time-dependent scenarios of FIGS. 3A-3C in accordance with an illustrative embodiment. FIG. 3I depicts the least squares error between ground truth and trained output fields for the time-independent scenarios of FIGS. 3F-3H in accordance with an illustrative embodiment. FIG. 3E depicts an overlap integral over all time at the point directly after the material for time-dependent results of FIGS. 3A-3C in accordance with an illustrative embodiment. FIG. 3J depicts an overlap integral over all time at the point directly after the material for time-independent results of FIGS. 3F-3H in accordance with an illustrative embodiment.

Figure 3A:
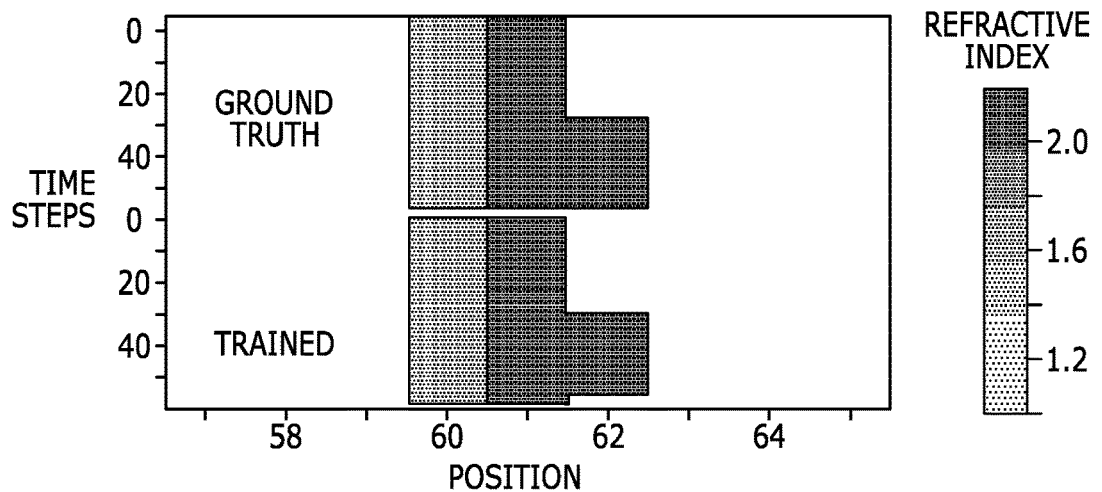
FIG. 3A depicts time-dependent results with 3 scatterers and 1 time change in accordance with an illustrative embodiment.
Figure 3B:
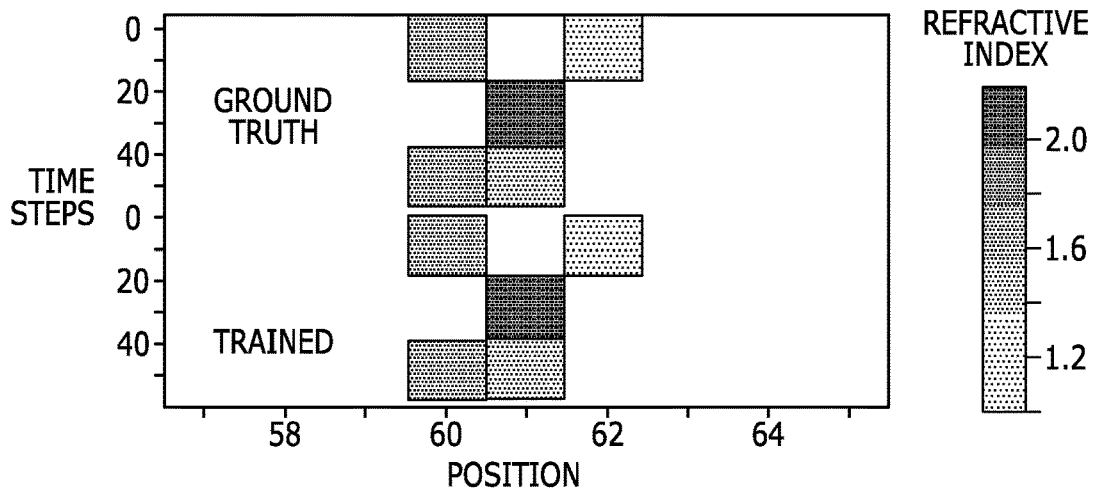
FIG. 3B depicts time-dependent results with 3 scatterers and 2 time changes in accordance with an illustrative embodiment.
Figure 3C:
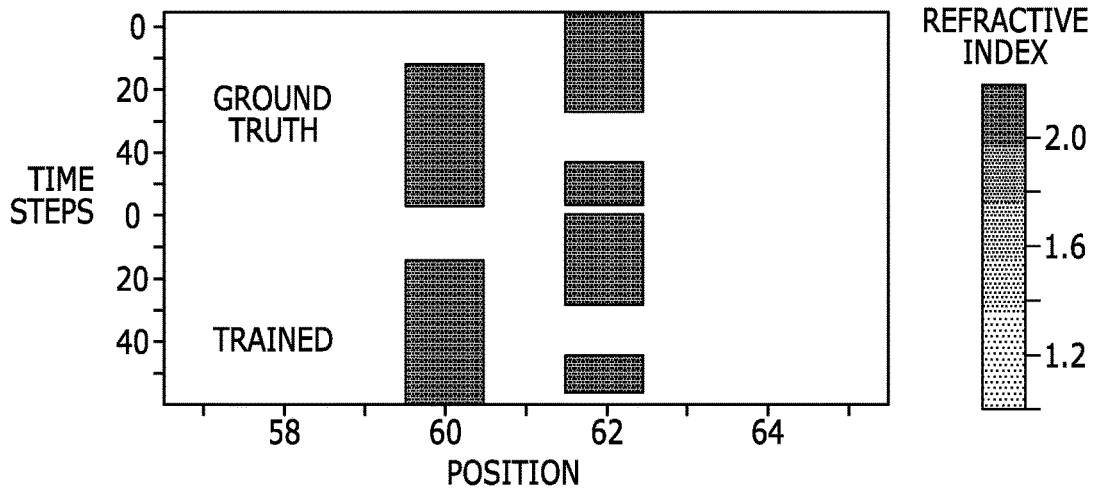
FIG. 3C depicts time-dependent results with 3 scatterers and 3 time changes in accordance with an illustrative embodiment.
Figure 3D:
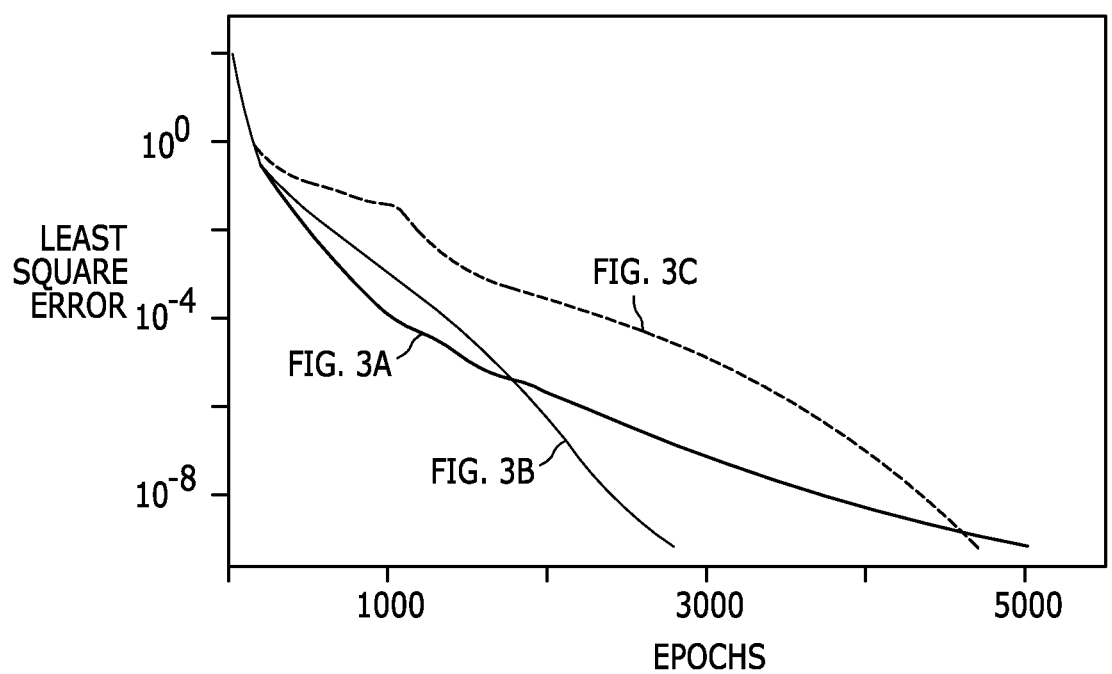
FIG. 3D depicts the least squares error between ground truth and trained output fields for a time-dependent scenario in accordance with an illustrative embodiment.
Figure 3E:
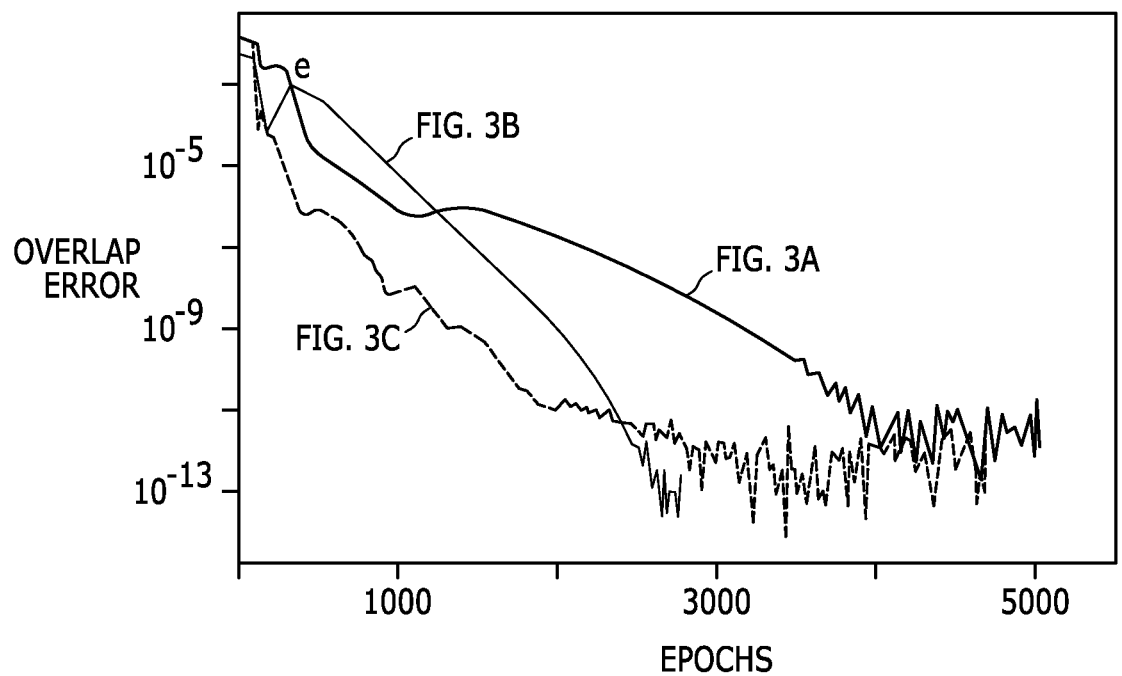
FIG. 3E depicts an overlap integral over all time at the point directly after the material for time-dependent results in accordance with an illustrative embodiment.
Figure 3F:
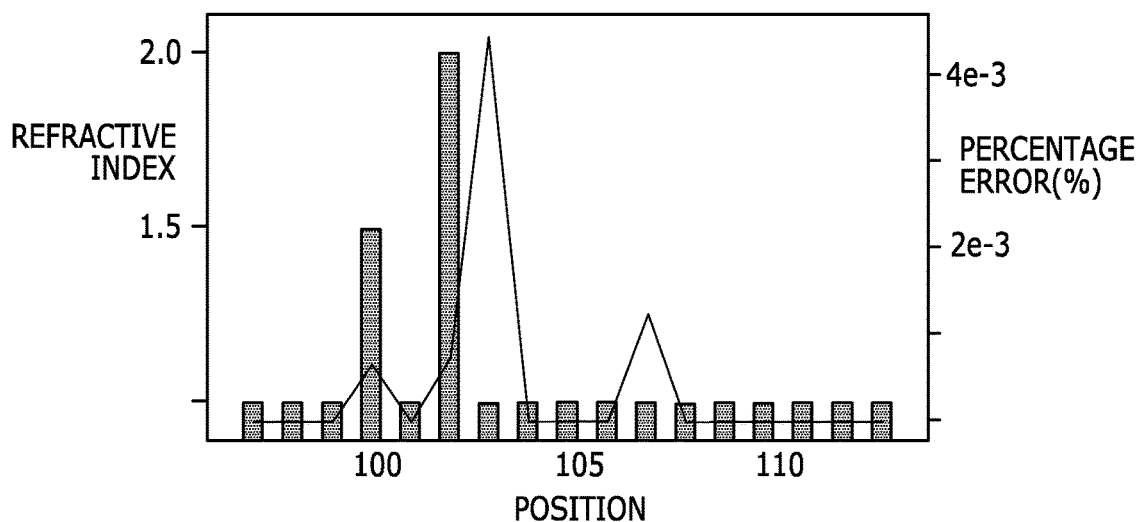
FIG. 3F depicts time independent results with 2 scatterers in accordance with an illustrative embodiment.
Figure 3G:
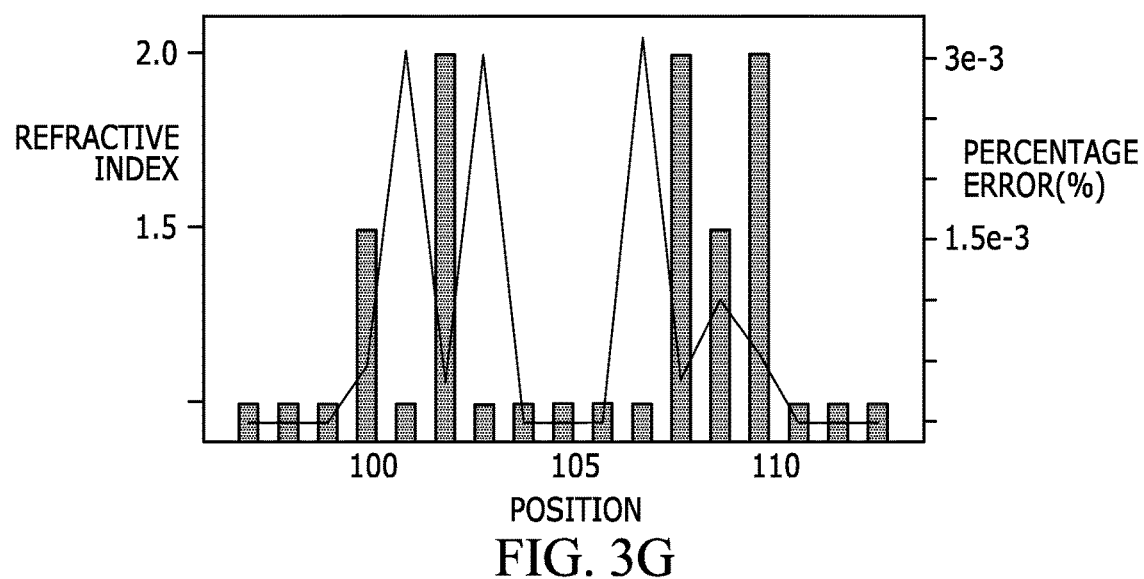
FIG. 3G depicts time independent results with 5 scatterers in accordance with an illustrative embodiment.
Figure 3H:
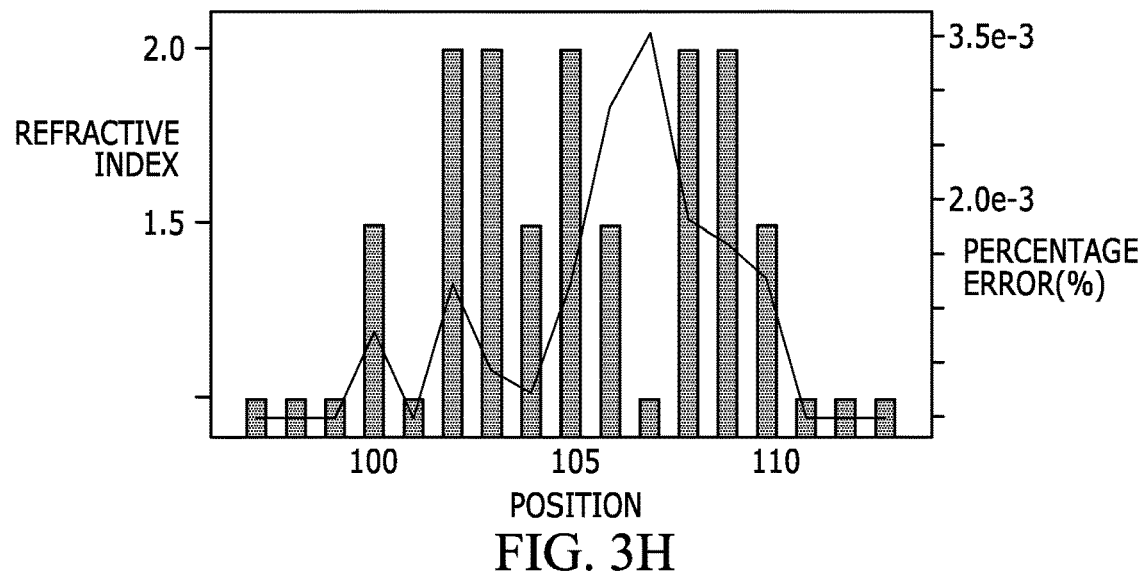
FIG. 3H depicts time independent results with 9 scatterers in accordance with an illustrative embodiment.
Figure 3I:
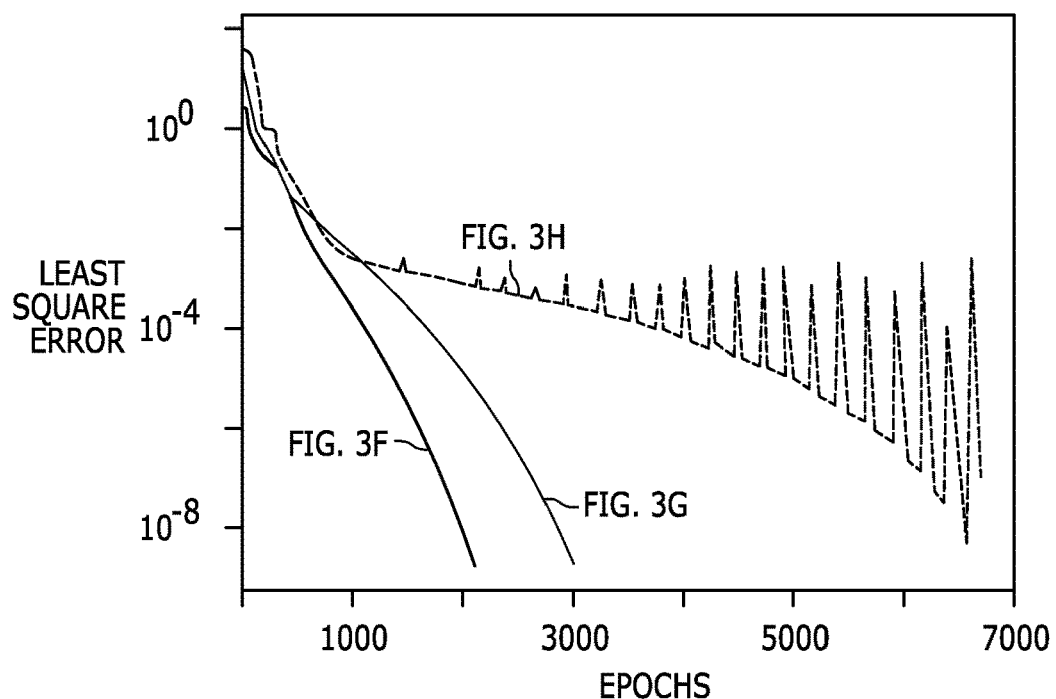
FIG. 3I depicts the least squares error between ground truth and trained output fields for a time-independent scenario in accordance with an illustrative embodiment.
Figure 3J:
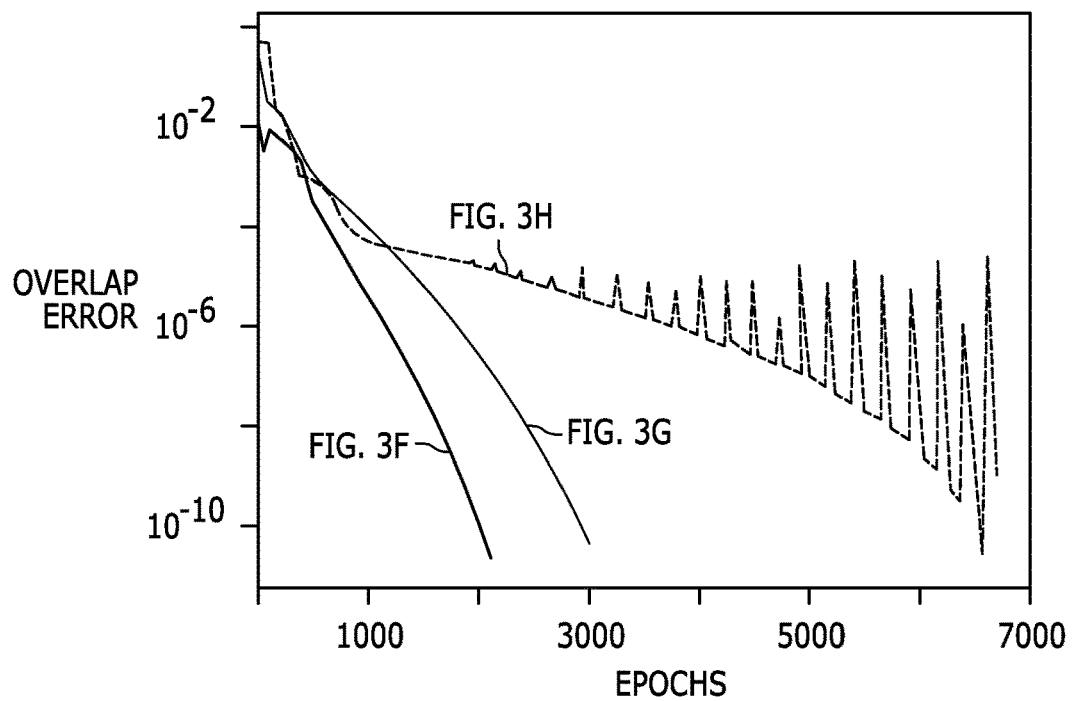
FIG. 3J depicts an overlap integral over all time at the point directly after the material for time-independent results in accordance with an illustrative embodiment.

As described above with reference to FIG. 3, to evaluate the tomography and inverse design capabilities of STSN, both static and time-dependent refractive index distributions were trained, using the optical response of the media to incident pulses of light (see FIGS. 3A-3D and 3F-3I). The percent error average and standard deviation between the trained and ground truth refractive index distributions were calculated to quantify the prediction error (i.e. a figure of merit for tomography) and are shown in the table of FIG. 4. Specifically, FIG. 4 depicts the percent error average and standard deviation between the ground truth and trained refractive index distributions shown in FIG. 3 in accordance with an illustrative embodiment. It is noted that in FIG. 4, the 3A*, 3B*, and 3C* entries depict average error and standard deviation obtained by excluding the last five time steps. Specifically, for time-dependent refractive indices the model cannot reconstruct their values for the final five time steps and when they are excluded, an average percent error below 1% is achieved for all examples. The error between the desired and achieved optical response was also quantified as the sum of the difference in space-time (overlap integral) between the desired and achieved responses at the point in space directly after the material, to quantify the inverse design error, as shown in FIGS. 3E and 3J.

To further validate the system performance, an inversely designed notch filter example was taken from one of the best reported non-physics based optimizations using neural networks (i.e., reference model) to demonstrate the performance of the proposed STSN, as discussed with reference to FIG. 5. The demonstration indicates that the proposed model accurately produces the notch filter while using four orders of magnitude less weights than the reference model and only one training set, as shown in the table of FIG. 6.

Figure 5A:
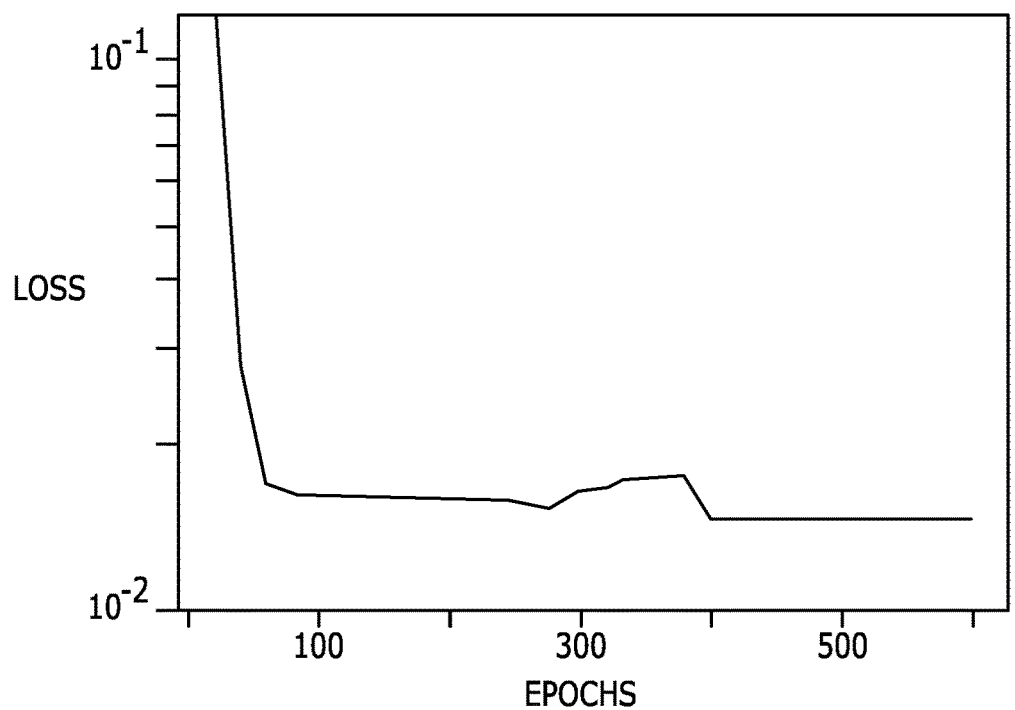
FIG. 5A depicts the cost function between transmitted and expected spectrums in accordance with an illustrative embodiment.
Figure 5B:
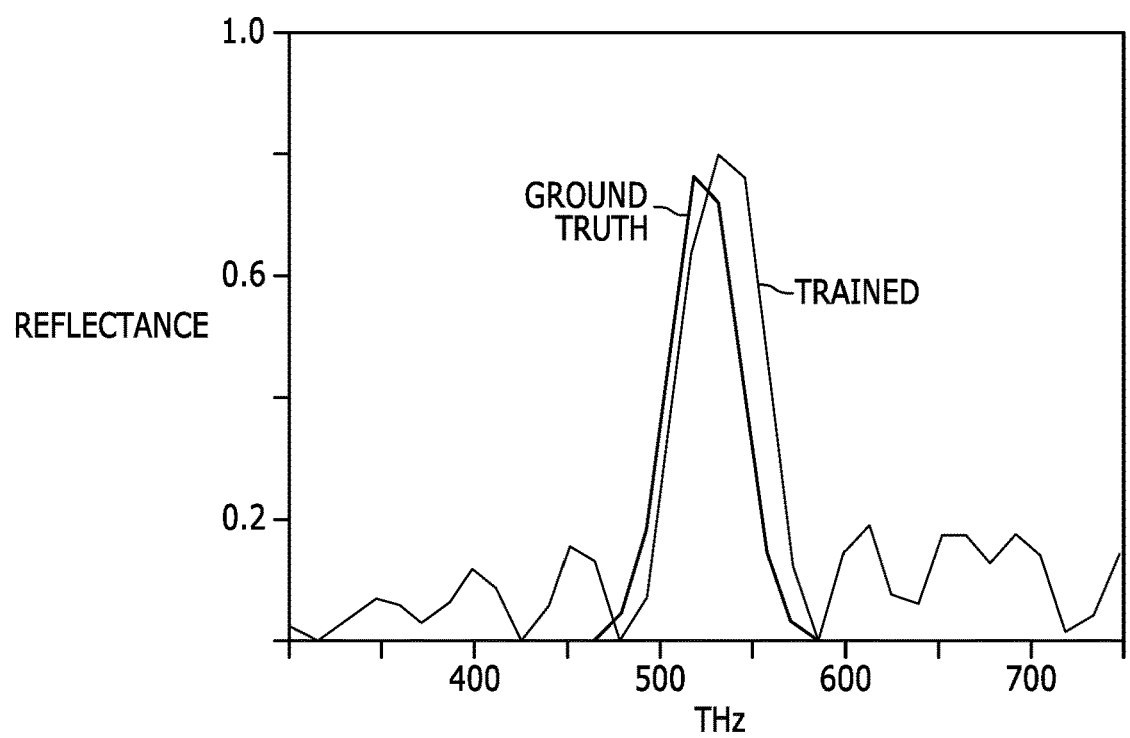
FIG. 5B depicts resulting reflectance of the notch filter in accordance with an illustrative embodiment.
Figure 5C:
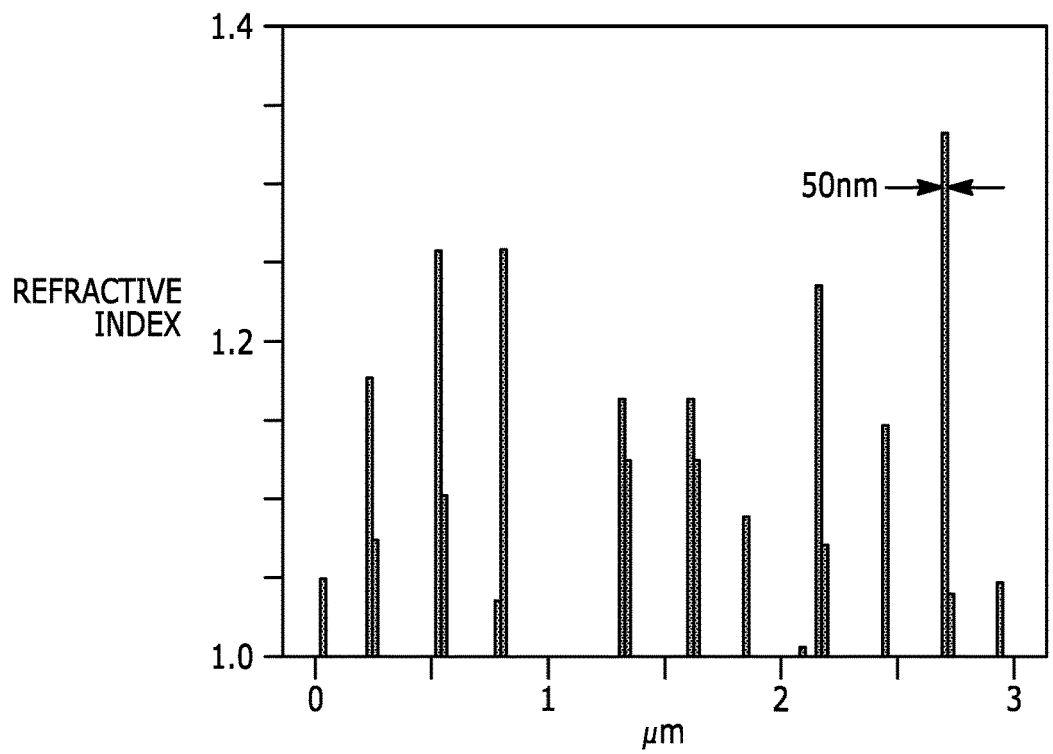
FIG. 5C depicts the resulting dielectric structure with 50 nanometer (nm) resolution in accordance with an illustrative embodiment.
Figure 5D:
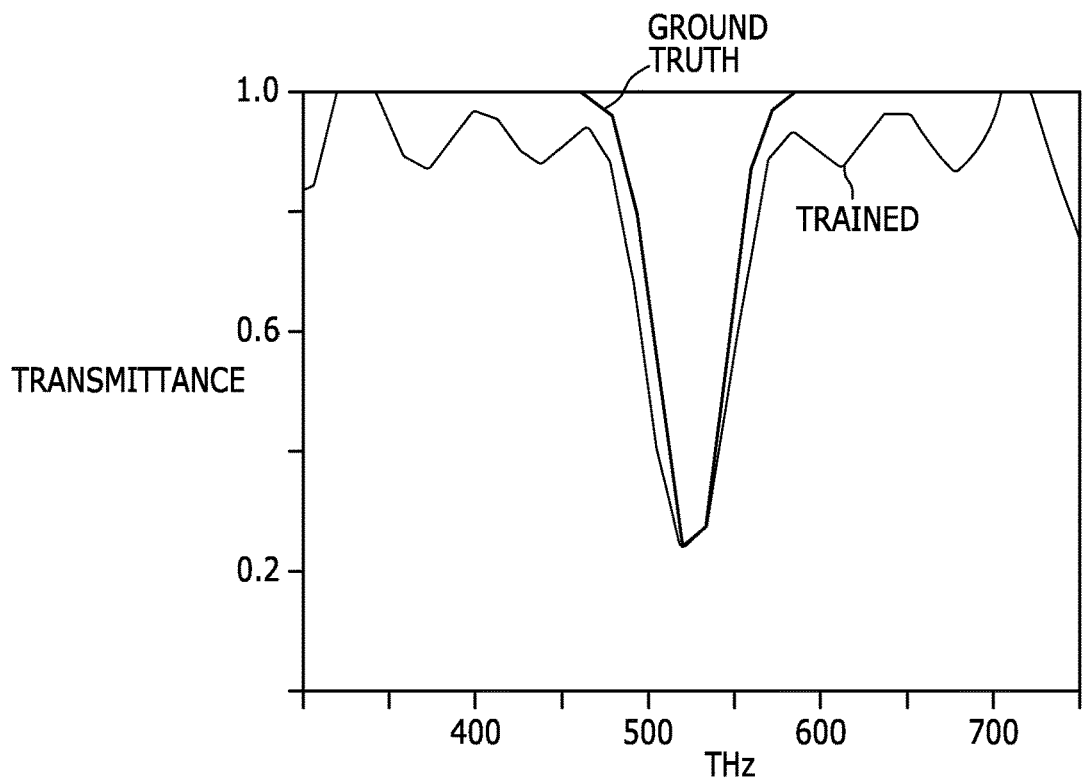
FIG. 5dD depicts resulting transmittance of the notch filter in accordance with an illustrative embodiment.

FIGS. 5A-5D depict results of a notch filter designed using the proposed STSN. Specifically, FIG. 5A depicts the cost function between transmitted and expected spectrums in accordance with an illustrative embodiment. FIG. 5B depicts resulting reflectance of the notch filter in accordance with an illustrative embodiment. FIG. 5C depicts the resulting dielectric structure with 50 nanometer (nm) resolution in accordance with an illustrative embodiment. FIG. 5D depicts resulting transmittance of the notch filter in accordance with an illustrative embodiment. To ensure an accurate comparison, the STSN model was constrained to 3 µms with 50 nm resolution which is comparable to the 1.1 µms and 8 nm resolution used in the reference model for comparison. An identical transmittance spectrum was used with fewer frequency points (20) and the structure was set to represent vacuum initially. FIG. 6 is a table depicting a comparison of the computing resources utilized by the STSN and the reference technique to inversely design the notch filter in accordance with an illustrative embodiment.

The many orders of magnitude lower computational cost of STSN in this inverse design example is attributed to its physics-based topology. The single training set suggests a causal network is achieved while the smaller weight count exhibits the efficiency of the STSN design. A physics-based approach does not waste resources on learning the physics of light propagation. For tomography applications, the STSN is shown to accurately recreate features densely packed in both time and space even with high refractive index profiles. While previous tomography models must resort to approximations with small backscattering, STSN is capable of handling optically complex structures that are also time-dependent.

The above-discussed simulation results demonstrate the advantages of using a space-time scattering network STSN for inverse design and tomography. The STSN can be used for inverse design and tomography of structures that are time-dependent and anisotropic. In one embodiment, the network is implemented in an open-source software (e.g., Tensorflow®), and can take advantage of the state-of-the-art hardware, such as graphical processing units (GPUs). It has been shown that an STSN can reproduce several refractive index structures that were both static and time-dependent. The STSN also was compared with one of the best reported inverse design methods based on a neural network. The STSN achieves the inverse design with orders of magnitude fewer weights and a much faster convergence rate. While the examples are based on 1D structures, STSN is easily translated into higher dimensions, as explained below. In addition, it has been shown that optical polarization and anisotropy of the material can also be included in 3D STSN seamlessly.

In one embodiment, to implement the proposed STSN, the weights are trained in the static and time-dependent case using TesnorFlow's built in Adam Optimizer method, and a least square cost function between trained and desired spatial signals at the final time step. For spectral results, the cost function is a least square function between desired and trained spectrums at a single point after the material. The training set is a single field over all space at the final time step. For the static case, only one training field is used. For the time-dependent case, the field's initial position is swept to produce a staggered set of fields at the final time step. The training sets are produced by running the STSN forward in time with the desired weight distribution.

To validate the STSN in Lumerical, 1500 position steps and 1300 time steps were taken in STSN to recreate the Lumerical simulation for the 1D simulation while 600 position steps were taken in the propagation direction, 300 in the perpendicular direction, and 1000 time steps were used. Additionally, 30 position steps were used to sample the wavelength of the Lumerical source. In 1D, a homogenous slab of 200 data points is present with refractive index of 2, while in 2D a cylinder with a radius of 110 position steps and a refractive index of 3.5 surrounded by a refractive index of 2 is present. To calculate the electromagnetic field in STSN, the forward and backward traveling field components are summed together in 1D. In 2D, this sum is multiplied by one half. All simulations use a pulsed plane wave and perfectly matched layers.

The proposed STSN can be expanded to higher dimensionalities, including 2D and 3D structures. This expansion is discussed below along with the formalism needed to include optical anisotropy in the model. The variables $E^{o,t}(x)$ and $E^{i,t}(x)$ can represent tensor fields of rank 1 with position vector x at time t. For 1D and 2D, the tensor contains the field components at each point in space and time. The field components are forward $E_f$ and backward $E_b$ for each Cartesian direction (x and y) as well as internal node components $E_n$. It follows that:

$$E^{o/i,t}(x) = [E_{fx}^{i/o,t}(x), E_{fy}^{i/o,t}(x), E_{bx}^{i/o,t}(x), E_{by}^{i/o,t}(x), E_n^{i/o,t}(x)] \quad \text{Eq. 1:}$$

In the third dimension, the internal field is dropped, and polarization is introduced. Therefore, there are now four field components for each direction, namely two for direction and two for polarization. The S Tensor S(x) is a tensor field of rank 2 that transforms the input and output fields at each point in space through a scattering matrix, and $E^{o,t}(x)=S(x)E^{i,t}(x)$. For 1D, S(x) is equal to the following:

$$S(x=x) = \frac{1}{2+W(x)}\begin{bmatrix} 2 & -W(x) & 2W(x) \\ -W(x) & 2 & 2W(x) \\ 2 & 2 & W(x)-2 \end{bmatrix} \quad \text{Eq. 2}$$

In the above matrix in Equation 2, W(x) is a scalar field and represents the weight values in space. This weight is trained by the neural network and is related to the physical dielectric constant through the following equation:

$$\epsilon_r(x) = 1 + \frac{W(x)}{2} \quad \text{Eq. 3}$$

Higher dimensionality and anisotropic implementations can also be achieved. For 2D, S(x) is shown below, where W(x, y) is a scalar field and represents the weight values in space. This weight is related to the physical dielectric constant through the following equations:

$$\epsilon_r(x, y) = 2 + \frac{W(x, y)}{2} \quad \text{Eq. 4}$$

$$S(x=[x,y]) = \frac{1}{4+W(x,y)}\begin{bmatrix} 2 & 2 & -W(x,y)-2 & 2 & 2W(x,y) \\ 2 & 2 & 2 & -W(x,y)-2 & 2W(x,y) \\ -W(x,y)-2 & 2 & 2 & 2 & 2W(x,y) \\ 2 & -W(x,y)-2 & 2 & 2 & 2W(x,y) \\ 2 & 2 & 2 & 2 & W(x,y)-4 \end{bmatrix} \quad \text{Eq. 5}$$

Three dimensions can be easily constructed using the transmission line matrix (TLM) method's symmetrical super-condensed node. The node introduces polarizations and eliminates the need for internal node fields. More recent work has focused on dispersive mediums and could be implemented using STSN methods. The scatter tensor field is (S2). Subscripts have been used in place of standard functional notation for readability and are defined as:

$$a_{ij} = 1 - b_{ij} - d_{ij}, \quad \text{Eq. 6:}$$

$$c_{ij} = d_{ij} - b_{ij}, \quad \text{Eq. 7:}$$

$$b_{ij} = \hat{C}_{kj}, \text{ and} \quad \text{Eq. 8:}$$

$$d_{ij} = \hat{C}_{ik}, \quad \text{Eq. 9:}$$

where $\hat{C}$ is a scalar field and is related to the dielectric constant with polarization direction j by:

$$\hat{C}_{ik}\hat{C}_{ij} = \left(\frac{\Delta t}{\Delta i}\right)^2 \frac{c^4}{\varepsilon_j}. \quad \text{Eq. 10}$$

In Equation 10 above, $\Delta t$ is the time step, $\Delta i$ the spatial step in direction i, $\varepsilon_j$ is the relative dielectric constant in polarization direction j, and c is the speed of light in vacuum. It is noted that anisotropic materials are allowed in both permeability and permittivity. However, it is assumed that anisotropic permittivity is only due to the simplicity of its relationship to the scattering matrix's weights.

The Translation operator can be defined as follows:

$$E_j^{i,t+\Delta t}(x+\Delta x) = E_j^{o,t}(x+\Delta x) = T_j E_j^{o,t}(x), \quad \text{Eq. 11:}$$

where j is the element of the rank 1 tensor field E making $T_j$ a rank 2 tensor in the form of a matrix, as follows:

$$S(x=[x,y,z])=\begin{bmatrix} a_{xy} & b_{xy} & d_{xy} & - & - & - & - & - & b_{xy} & - & -d_{xy} & c_{xy} \\ b_{xz} & a_{xz} & - & - & - & d_{xz} & - & - & c_{xz} & -d_{xz} & - & b_{xz} \\ d_{yx} & - & a_{yx} & b_{yx} & - & - & - & b_{yx} & - & - & c_{yx} & -d_{yx} \\ - & - & b_{yz} & a_{yz} & d_{yz} & - & -d_{yz} & c_{yz} & - & - & b_{yz} & - \\ - & - & - & d_{zy} & a_{zy} & b_{zy} & c_{zy} & -d_{zy} & - & b_{zy} & - & - \\ - & d_{zx} & - & - & b_{zx} & a_{zx} & b_{zx} & - & -d_{zx} & c_{zx} & - & - \\ - & - & - & -d_{zy} & c_{zy} & b_{zy} & a_{zy} & d_{zy} & - & b_{zy} & - & - \\ - & - & b_{yz} & c_{yz} & -d_{yz} & - & d_{yz} & a_{yz} & - & - & b_{yz} & - \\ b_{xz} & c_{xz} & - & - & - & -d_{xz} & - & - & a_{xz} & d_{xz} & - & b_{xz} \\ - & d_{zx} & - & - & b_{zx} & c_{zx} & b_{zx} & - & d_{zx} & a_{zx} & - & - \\ -d_{yx} & - & c_{yx} & b_{yx} & - & - & - & b_{yx} & - & - & a_{yx} & d_{yx} \\ c_{xy} & b_{xy} & -d_{xy} & - & - & - & - & - & b_{xy} & - & d_{xy} & a_{xy} \end{bmatrix}$$

Eq. 12

Thus, the STSN methods can be readily extended to additional dimensionalities for use in a variety of different applications. For example, the embodiments described herein can be used to design extremely compact, low-cost, and multi-functional components. In one implementation, the techniques described herein can be used to design complex lenses which replace simple lenses. For example, the optics and sensors of a camera can be developed to form a credit card sized camera that is flexible. The optics and sensors for the camera can be implemented as a single non-linear element. The embodiments described herein can also be used in optical coherence tomography, CT scan technology, light detecting and ranging (LIDAR) devices, etc.

An STSN can also be used to image hidden objects in 3D using any type of electromagnetic waves, such as radio, mm-wave, microwave, infrared, visible, UV, x-ray, gamma rays, etc. This is most applicable to fields of medical imaging, security, mining, robotics, etc. Used in conjunction with inverse design, the STSN can be used to design compact and multi-functional photonics, microwave, THz, infrared (and acoustics) elements with unprecedented properties. This is most applicable to the field of computer design of components and systems. While the implemented STSNs described herein were for photons (electromagnetic field), an STSN can also be implemented for phonons (acoustics), or other particles.

It is to be understood that any of the operations/processes described herein may be performed at least in part by a computing system or unit that includes a processor, memory, transceiver, user interface, etc. The described operations/processes can be implemented as computer-readable instructions stored on a computer-readable medium such as the computer system memory. Upon execution by the processor, the computer-readable instructions cause the computing system to perform the operations/processes described herein. Additionally, the systems described herein can include a light source such as a laser, light-emitting diode, etc. that is used to generate the light to be scattered by the material. The light source can be used in conjunction with optics to direct the light as known in the art. In another illustrative embodiment, the system can be implemented using a computing unit such as a neuromorphic computer or a quantum computer.

Figure 7:
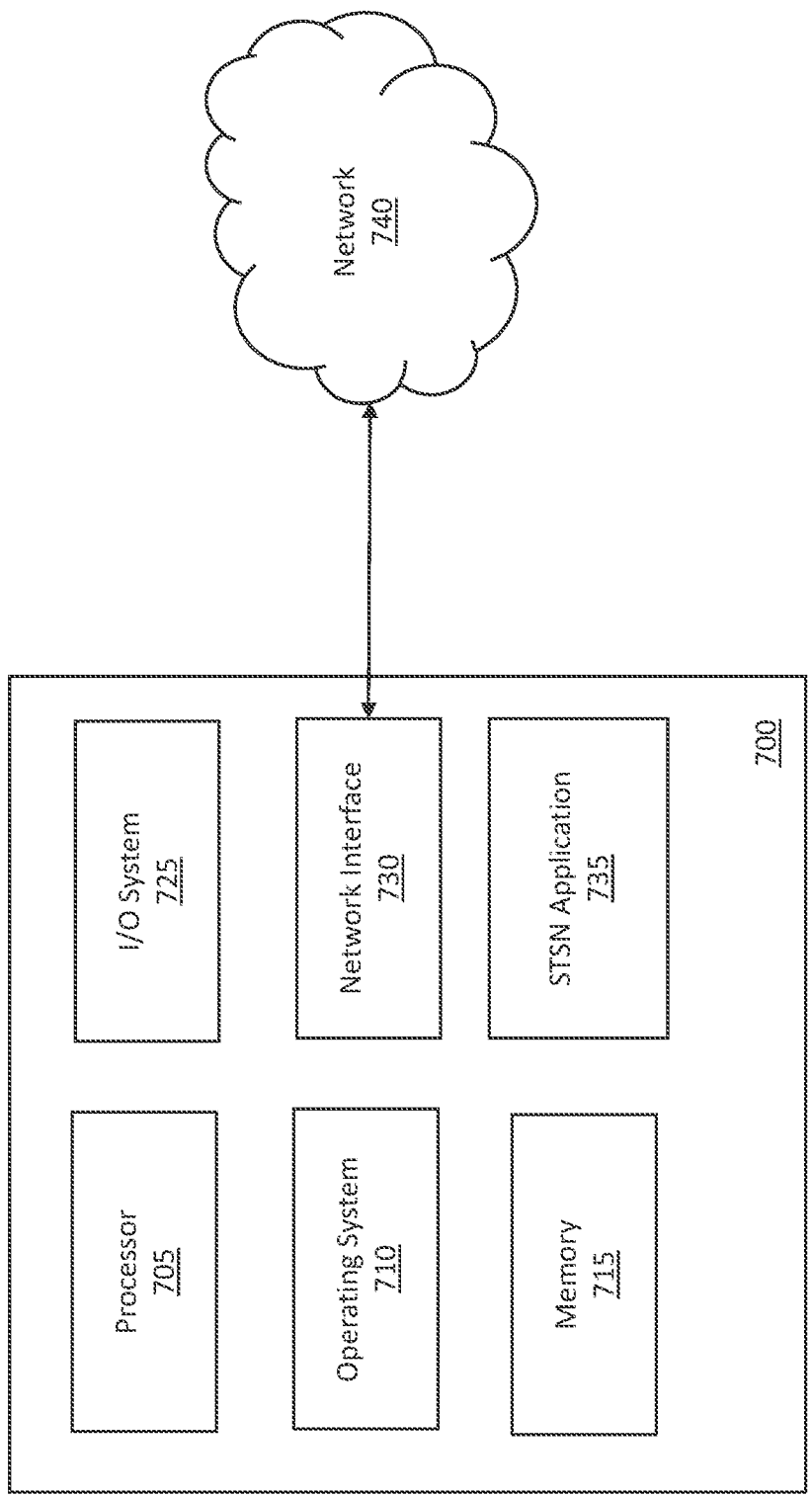
FIG. 7 is a block diagram of a computing system for an STSN generating system in accordance with an illustrative embodiment.

FIG. 7 is a block diagram of a computing system 700 for an STSN generating system in accordance with an illustrative embodiment. The computing system 700 includes a processor 705, an operating system 710, a memory 715, an I/O system 725, a network interface 730, and an STSN application 735. In alternative embodiments, the computing system 700 may include fewer, additional, and/or different components. The components of the computing system 700 communicate with one another via one or more buses or any other interconnect system. In an illustrative embodiment, the computing system 700 can be part of a laptop computer, desktop computer, tablet, an optics component generation system, etc.

The processor 705 can be any type of computer processor known in the art, and can include a plurality of processors and/or a plurality of processing cores. The processor 705 can include a controller, a microcontroller, an audio processor, a graphics processing unit, a hardware accelerator, a digital signal processor, etc. Additionally, the processor 705 may be implemented as a complex instruction set computer processor, a reduced instruction set computer processor, an x86 instruction set computer processor, etc. The processor 705 is used to run the operating system 710, which can be any type of operating system.

The operating system 710 is stored in the memory 715, which is also used to store programs, network and communications data, peripheral component data, light data such as wavelength information, material information, material dimensions, the STSM application 735, and other operating instructions. The memory 715 can be one or more memory systems that include various types of computer memory such as flash memory, random access memory (RAM), dynamic (RAM), static (RAM), a universal serial bus (USB) drive, an optical disk drive, a tape drive, an internal storage device, a non-volatile storage device, a hard disk drive (HDD), a volatile storage device, etc.

The I/O system 725 is the framework which enables users and peripheral devices to interact with the computing system 700. The I/O system 725 can include a mouse, a keyboard, one or more displays, a speaker, a microphone, etc. that allow the user to interact with and control the computing system 700. The I/O system 725 also includes circuitry and a bus structure to interface with peripheral computing devices such as power sources, USB devices, peripheral component interconnect express (PCIe) devices, serial advanced technology attachment (SATA) devices, high definition multimedia interface (HDMI) devices, proprietary connection devices, etc. In an illustrative embodiment, the I/O system 725 is configured to receive inputs and operating instructions from the user.

The network interface 730 includes transceiver circuitry that allows the computing system to transmit and receive data to/from other devices such as remote computing systems, servers, websites, etc. The network interface 730 enables communication through the network 740, which can be in the form of one or more communication networks and devices. For example, the network 740 can include a cable network, a fiber network, a cellular network, a wi-fi network, a landline telephone network, a microwave network, a satellite network, etc. and any devices/programs accessible through such networks. The network interface 730 also includes circuitry to allow device-to-device communication such as Bluetooth® communication.

The STSN application 735 includes hardware and/or software, and is configured to perform any of the operations described herein. Software of the STSN application 735 can be stored in the memory 715. As an example, the STSN application 735 can include computer-readable instructions to turn one or more light sources of the system on and off. The light coupling application 735 can also include computer-readable instructions to adjust/control a wavelength of the one or more light sources, to adjust/control an intensity of the light sources, determine tensor fields, solve matrices, equations, and algorithms, etc.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A system to generate a space-time scattering network, the system comprising:
    a computing unit configured to:
    store a space-time scattering network (STSN) algorithm; and
    execute the STSN algorithm to represent scattering of light through a material mathematically as a tensor field at a location;
    generate a subnet that represents the tensor field at the location;
    identify, based on a translation operator, connections between a plurality of subnets, wherein each of the subnets in the plurality of subnets represents a given tensor field at a given location;
    form the STSN based at least in part on the identified connections between the plurality of subnets; and
    use the STSN to inversely design a material to have a specific response to electromagnetic radiation or to perform tomography;
    wherein the computing unit includes hardware and software, and wherein the hardware, the software, or a combination of the hardware and the software is configured to form the STSN as a neural network, and wherein a number of unknown weights in the neural network is equal to a number of unknown optical parameters in a design space of the system.

2. The system of claim 1, wherein the location of the tensor field is given by a position vector.

3. The system of claim 1, wherein the tensor field couples an incoming tensor field and an outgoing tensor field at the location.

4. The system of claim 1, wherein the tensor field is based on optical properties of the material.

5. The system of claim 1, wherein the translation operator defines a temporal connection between the plurality of subnets.

6. The system of claim 1, wherein the subnet represents optical properties of the material at the location, and wherein the location comprises a point in space.

7. The system of claim 6, wherein one or more weights associated with the subnet are based on a refractive index of the material.

8. The system of claim 7, wherein the one or more weights change over time as the refractive index changes over time.

9. A method for generating a space-time scattering network, the method comprising:
    representing, by a computing unit, scattering of light through a material mathematically as a tensor field at a location;
    generating, by the computing unit, a subnet that represents the tensor field at the location;
    identifying, by the computing unit and based on a translation operator, connections between a plurality of subnets, wherein each of the subnets in the plurality of subnets represents a given tensor field at a given location;
    forming, by the computing unit, the STSN based at least in part on the identified connections between the plurality of subnets, wherein forming the STSN comprises forming the STSN as a neural network, and wherein a number of unknown weights in the neural network is equal to a number of unknown optical parameters in a design space for an optical component; and
    using, by the computing unit, the STSN to inversely design the optical component or to perform tomography.

10. The method of claim 9, further comprising determining the tensor field by coupling an incoming tensor field and an outgoing tensor field at the location.

11. The method of claim 9, wherein the tensor field is based on optical properties of the material.

12. The method of claim 9, wherein the translation operator defines a temporal connection between the plurality of subnets.

13. A tangible computer-readable medium having computer-readable instructions stored thereon that, upon execution by a processor of a computing system, cause the computing system to:
    represent scattering of light through a material mathematically as a tensor field at a location;
    generate a subnet that represents the tensor field at the location;
    identify, based on a translation operator, connections between a plurality of subnets, wherein each of the subnets in the plurality of subnets represents a given tensor field at a given location;
    form a space-time scattering network (STSN) based at least in part on the identified connections between the plurality of subnets, wherein the STSN is formed as a neural network, and wherein a number of unknown weights in the neural network is equal to a number of unknown optical parameters in a design space for an optical component; and use the STSN to inversely design the optical component or to perform tomography.

14. The tangible computer-readable medium of claim 13, wherein the computer-readable instructions further cause the computing system to determine the tensor field by coupling an incoming tensor field and an outgoing tensor field at the location.

\* \* \* \* \*